(12) United States Patent
Toguchi et al.

(10) Patent No.: US 6,771,018 B2
(45) Date of Patent: Aug. 3, 2004

(54) LIGHT-EMITTING DEVICE AND DISPLAY DEVICE EMPLOYING ELECTROLUMINESCENCE WITH NO LIGHT LEAKAGE AND IMPROVED LIGHT EXTRACTION EFFICIENCY

(75) Inventors: Satoru Toguchi, Tokyo (JP); Atsushi Oda, Tokyo (JP); Hitoshi Ishikawa, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 187 days.

(21) Appl. No.: 10/202,214

(22) Filed: Jul. 24, 2002

(65) Prior Publication Data

US 2003/0043571 A1 Mar. 6, 2003

(30) Foreign Application Priority Data

Jul. 30, 2001 (JP) .......................................... 2001-230414

(51) Int. Cl.⁷ .................................................. H01J 1/62
(52) U.S. Cl. ........................................ 313/498; 313/113
(58) Field of Search ............................... 313/498, 501, 313/505, 506, 509, 112, 113

(56) References Cited

FOREIGN PATENT DOCUMENTS

| JP | SHO 62-172691 | 7/1987 |
| JP | SHO 63-314795 | 12/1988 |
| JP | HEI 11-8070 | 1/1999 |
| JP | 2000-323272 | 11/2000 |

OTHER PUBLICATIONS

C.W. Tang and S.A. VanSlyke, "Organic electroluminescent diodes", *Applied Physics Letters; American Institute of Physics*, 51:913–915 (1987).
Tetsuo Tsutsui, Present situation and trends in organic electroluminescence, *"Display (monthly)"* vol. 1, No. 3, p. 11(1995).

*Primary Examiner*—Vip Patel
(74) *Attorney, Agent, or Firm*—McGuireWoods LLP

(57) ABSTRACT

In a light-emitting device comprising an organic electroluminescent device including one or more organic thin layers (at least including a light-emitting layer) which are sandwiched between a transparent first electrode formed on a light-transmitting substrate and a second electrode, the light-transmitting substrate is formed so as to include parts for reflecting light emitted by the organic electroluminescent device (corresponding to a pixel) and thereby preventing the light from entering adjacent pixel areas. The light-transmitting substrate is formed of material having a refractive index of 1.65 or more or a refractive index higher than that of the light-emitting layer. A surface of the light-transmitting substrate opposite to the first electrode is provided with a light-diffusing function for avoiding total reflection. By such composition, a light-emitting device with no light leakage and excellent light extraction efficiency can be realized and thereby a high-intensity low-voltage-driven display device can be realized.

62 Claims, 6 Drawing Sheets

LIGHT-EMITTING DEVICE AND DISPLAY DEVICE EMPLOYING ELECTROLUMINESCENCE WITH NO LIGHT LEAKAGE AND IMPROVED LIGHT EXTRACTION EFFICIENCY

BACKGROUND OF THE INVENTION

The present invention relates to a light-emitting device employing light emission from an organic electroluminescent device and a display device employing a plurality of such light-emitting devices by which mixture of light emitted by adjacent organic electroluminescent devices is avoided and thereby light extraction efficiency (efficiency in extracting light from the light-emitting devices to outside) is improved.

DESCRIPTION OF THE RELATED ART

An organic electroluminescent device (which will hereinafter be called "organic EL device") is a light-emitting device which makes use of the principle that when an electric field is applied, a fluorescent material emits light in response to the charge recombination of holes injected from an anode and electrons injected from a cathode. Since a report on a low-voltage-driven organic EL device employing multilayered structure was released by C. W. Tang et al. of Eastman Kodak Co. (C. W. Tang, S. A. VanSlyke, Applied Physics Letters, Vol.51, page 913 (1987)), extensive researches have been made on organic EL devices, that is, EL devices employing organic materials.

In the above report, an organic EL device employing tris(8-quinolinol)aluminum complex for the light-emitting layer and triphenyldiamine derivative for the hole transporting layer was fabricated on a glass substrate. The multilayer structure has some advantages such as: improved hole injection to the light-emitting layer; increase of production efficiency of excitons which are generated by recombination (by blocking the paths of electrons injected from the cathode); and confinement of the excitons generated in the light-emitting layer.

As the structure of the organic EL devices, two-layer types (including a hole transporting (and injection) layer and an electron transporting light-emitting layer) and three-layer types (including a hole transporting (and injection) layer, a light-emitting layer and an electron transporting layer) are well known. In order to increase the recombination efficiency of injected holes and electrons, various improvements in the device structure or fabrication process have been introduced to such multi-layered devices.

Further, organic EL devices involve certain limitations on the probability of the creation of singlet excited states of light-emitting material molecules on carrier recombination since the carrier recombination is dependent on spin statistics, thereby the probability of light emission is necessitated to have an upper limit. The upper limit is known as approximately 25%.

Furthermore, in organic EL devices, rays of light whose outgoing angles (getting out of the light-emitting layer) are larger than a critical angle (depending on the refractive index of the light-emitting material) can not get out of the light-emitting layer due to total reflection. Therefore, when the refractive index of the light-emitting material is 1.6, only about 20% of the total light emission is available outside, and the upper limit of energy conversion efficiency becomes as low as approximately 5% taking the singlet excited state creation probability into account (Tetsuo Tsutsui "Present situation and trends in organic electroluminescence", Display (monthly), vol.1, No.3, page 11 (September 1995). In organic EL devices, having tight limitations on the light emission probability, low light extraction efficiency (low efficiency in extracting light from the organic EL device to outside) causes fatal deterioration of the (total) luminescent efficiency.

Methods for improving the light extraction efficiency have been studied so far for light-emitting devices of similar structure such as inorganic EL devices. For example, in Japanese Patent Application Laid-Open No. SHO 63-314795, the light extraction efficiency is improved by forming or attaching light convergent optics on substrate, which is effective for devices having large light-emitting areas. However, in light-emitting devices whose pixel areas are small (such as dot matrix displays), the formation of lenses for light convergence is difficult.

In another method disclosed in Japanese Patent Application Laid-Open No. SHO 62-172691, an anti-reflection coating is formed by providing a flat layer of an intermediate refractive index between the substrate glass and the light-emitting layer, thereby the light extraction efficiency to the front is improved considerably. However, the aforementioned total reflection can not be eliminated by the method. Therefore, while being effective for inorganic EL devices (including materials with large refractive indices), the method can not effectively improve the light extraction efficiency of organic EL devices (including light-emitting materials of relatively low refractive indices).

In order to reduce the total reflection at a surface of the substrate opposite to the organic EL device, Japanese Patent Application Laid-Open No.2000-323272 disclosed a technique for providing the substrate surface with a function for diffusing light. However, the technique can not achieve a marked effect for the conventional glass substrates since the rate of total reflection of light at the interface between the organic EL device and the glass substrate is high. Further, if a light-emitting device having a plurality of organic EL devices arranged in a matrix is manufactured using such a substrate having the light-diffusing function, light emitted by an organic EL device (corresponding to a pixel area) tends to reach adjacent pixel areas, thereby the light leakage problem (light emission from pixel areas that are not supposed to emit light) occurs.

In order to resolve the light leakage problem, Japanese Patent Application Laid-Open No. HEI11-8070 disclosed a method, in which a black mask and a light diffusing layer were formed between the substrate and the organic EL devices. However, the method further deteriorates the light extraction efficiency, since part of the light emitted by the organic EL devices is absorbed by the black mask.

As described above, the prevention of light leakage and the improvement of light extraction efficiency in light-emitting devices employing organic EL devices are both still insufficient. Especially in the method of Japanese Patent Application Laid-Open No. HEI11-8070, the light extraction efficiency (main problem to be resolved) is sacrificed for the prevention of light leakage. Therefore, techniques capable of satisfying both of the requirements are being sought for, and the development of such techniques is essential for practical utilization of the organic EL devices.

SUMMARY OF THE INVENTION

It is therefore the primary object of the present invention to provide a light-emitting device and a display device of high performance by preventing the light leakage and improving the light extraction efficiency of the light-emitting device including an organic EL device.

In accordance with a first aspect of the present invention, there is provided a light-emitting device comprising an organic electroluminescent device including one or more organic thin layers at least including a light-emitting layer which are sandwiched between a transparent first electrode formed on a light-transmitting substrate and a second electrode. In the light-emitting device, the light-transmitting substrate at least includes reflection means for reflecting light emitted by the organic electroluminescent device corresponding to a pixel and thereby preventing the light from entering adjacent pixel areas, and the light-transmitting substrate has a refractive index of 1.65 or more.

In accordance with a second aspect of the present invention, in the first aspect, in a cross section taken along a plane perpendicular to both a reflecting surface of the reflection means and the light-transmitting substrate, the height h of the reflection means measured from a contacting surface of the light-transmitting substrate with the first electrode is set so as to satisfy $h \geq H \cdot 4t/(1+3t)$. Here, $t=d/D$, D: the distance between the centers of two reflection means surrounding the organic electroluminescent device, d: the distance between two reflecting surfaces of the two reflection means facing the organic electroluminescent device, and H: the distance between the contacting surface and an opposite surface of the light-transmitting substrate.

In accordance with a third aspect of the present invention, in the first aspect, a surface of the light-transmitting substrate opposite to the first electrode is provided with light-diffusing means for diffusing the light emitted by the organic electroluminescent device.

In accordance with a fourth aspect of the present invention, in the third aspect, in a cross section taken along a plane perpendicular to both a reflecting surface of the reflection means and the light-transmitting substrate, the height h of the reflection means measured from a contacting surface of the light-transmitting substrate with the first electrode is set so as to satisfy $h \geq H \cdot 4t/(1+3t)$. Here, $t=d/D$, D: the distance between the centers of two reflection means surrounding the organic electroluminescent device, d: the distance between two reflecting surfaces of the two reflection means facing the organic electroluminescent device, and H: the distance between the contacting surface and an opposite surface of the light-transmitting substrate.

In accordance with a fifth aspect of the present invention, in the first aspect, a surface of the light-transmitting substrate opposite to the first electrode is provided with a second light-transmitting substrate having a refractive index of 1.65 or more and having light-diffusing means for diffusing the light emitted by the organic electroluminescent device on its surface opposite to the light-transmitting substrate.

In accordance with a sixth aspect of the present invention, in the fifth aspect, the refractive index of the second light-transmitting substrate is set higher than that of the light-transmitting substrate.

In accordance with a seventh aspect of the present invention, in the fifth aspect, the light-transmitting substrate and the second light-transmitting substrate are formed of resin.

In accordance with an eighth aspect of the present invention, in the seventh aspect, the light-emitting device further comprises a gas barrier layer which is provided between the light-transmitting substrate and the second light-transmitting substrate.

In accordance with a ninth aspect of the present invention, in the eighth aspect, the gas barrier layer is formed of material having gas barrier properties against $H_2O$ and/or oxygen.

In accordance with a tenth aspect of the present invention, in the eighth aspect, the light-emitting device further comprises a third light-transmitting substrate having a refractive index of 1.65 or more which is provided between the gas barrier layer and the light-transmitting substrate.

In accordance with an eleventh aspect of the present invention, in the first aspect, the reflection means is formed by metal that is embedded in the light-transmitting substrate.

In accordance with a twelfth aspect of the present invention, in the eleventh aspect, metal whose work function is 4.3 eV or less is employed as the metal embedded in the light-transmitting substrate.

In accordance with a thirteenth aspect of the present invention, in the eleventh aspect, the metal embedded in the light-transmitting substrate is formed so as to function also as an assist electrode for the first electrode.

In accordance with a fourteenth aspect of the present invention, in the thirteenth aspect, metal whose work function is 4.3 eV or less is employed as the metal embedded in the light-transmitting substrate.

In accordance with a fifteenth aspect of the present invention, there is provided a display device comprising: a plurality of first lines arranged in the same direction; a plurality of second lines arranged perpendicular to the first lines; the light-emitting devices of the first aspect which are placed corresponding to a plurality of pixel areas of the display device which are formed in a matrix of rows and columns by the first lines and the second lines; a voltage control circuit for controlling the voltages of the first lines and the second lines; common power supply lines for supplying driving currents to the light-emitting devices; and thin-film transistors each of which is provided corresponding to each pixel, for receiving a video signal at its gate and controlling the conduction between the common power supply line and the organic electroluminescent device.

In accordance with a sixteenth aspect of the present invention, in the fifteenth aspect, the reflection means of the light-emitting devices are implemented by arranging a plurality of combshaped metal parts, and each of the comb-shaped metal parts is formed so as to function also as an assist electrode for the first electrode.

In accordance with a seventeenth aspect of the present invention, in the fifteenth aspect, the reflection means of the light-emitting devices are implemented by arranging a plurality of metal parts having through-holes, and each of the metal parts having the through-holes is formed so as to function also as an assist electrode for the first electrode.

In accordance with eighteenth through twenty-ninth aspects of the present invention, there are provided display devices employing the light-emitting devices of the second through fifth aspects, similarly to the fifteenth, sixteenth and seventeenth aspects.

In accordance with thirtieth through forty-third aspects of the present invention, there are provided light-emitting devices having the same basic structure as the light-emitting devices of the first through fourteenth aspects. Instead of the light-transmitting substrate, the second light-transmitting substrate and the third light-transmitting substrate having refractive indices of 1.65 or more, a light-transmitting substrate, a second light-transmitting substrate and a third light-transmitting substrate having refractive indices higher than that of the light-emitting layer are employed.

In accordance with a forty-fourth aspect of the present invention, there is provided a display device comprising: a plurality of first lines arranged in the same direction; a plurality of second lines arranged perpendicular to the first lines; the light-emitting devices of the thirtieth aspect which are placed corresponding to a plurality of pixel areas of the display device which are formed in a matrix of rows and columns by the first lines and the second lines; a voltage control circuit for controlling the voltages of the first lines and the second lines; common power supply lines for supplying driving currents to the light-emitting devices; and thin-film transistors each of which is provided corresponding to each pixel, for receiving a video signal at its gate and controlling the conduction between the common power supply line and the organic electroluminescent device.

In accordance with a forty-fifth aspect of the present invention, in the forty-fourth aspect, the reflection means of the light-emitting devices are implemented by arranging a plurality of combshaped metal parts, and each of the combshaped metal parts is formed so as to function also as an assist electrode for the first electrode.

In accordance with a forty-sixth aspect of the present invention, in the forty-fourth aspect, the reflection means of the light-emitting devices are implemented by arranging a plurality of metal parts having through-holes, and each of the metal parts having the through-holes is formed so as to function also as an assist electrode for the first electrode.

In accordance with forty-seventh through fifty-eighth aspects of the present invention, there are provided display devices employing the light-emitting devices of the thirty-first through thirty-fourth aspects, similarly to the forty-fourth, forty-fifth and forty-sixth aspects.

In accordance with a fifty-ninth aspect of the present invention, there is provided a light-emitting device comprising an organic electroluminescent device including one or more organic thin layers at least including a light-emitting layer which are sandwiched between a transparent first electrode formed on a light-transmitting substrate and a second electrode. In the light-emitting device, the light-transmitting substrate has a refractive index of 1.65 or more, and a surface of the light-transmitting substrate opposite to the first electrode is provided with light-diffusing means for diffusing light emitted by the organic electroluminescent device.

In accordance with a sixtieth aspect of the present invention, there is provided a display device comprising: a plurality of first lines arranged in the same direction; a plurality of second lines arranged perpendicular to the first lines; the light-emitting devices of the fifty-ninth aspect which are placed corresponding to a plurality of pixel areas of the display device which are formed in a matrix of rows and columns by the first lines and the second lines; a voltage control circuit for controlling the voltages of the first lines and the second lines; common power supply lines for supplying driving currents to the light-emitting devices; and thin-film transistors each of which is provided corresponding to each pixel, for receiving a video signal at its gate and controlling the conduction between the common power supply line and the organic electroluminescent device.

In accordance with a sixty-first aspect of the present invention, there is provided a light-emitting device comprising an organic electroluminescent device including one or more organic thin layers at least including a light-emitting layer which are sandwiched between a transparent first electrode formed on a light-transmitting substrate and a second electrode. In the light-emitting device, the light-transmitting substrate has a refractive index higher than that of the light-emitting layer, and a surface of the light-transmitting substrate opposite to the first electrode is provided with light-diffusing means for diffusing light emitted by the organic electroluminescent device.

In accordance with a sixty-second aspect of the present invention, there is provided a display device comprising: a plurality of first lines arranged in the same direction; a plurality of second lines arranged perpendicular to the first lines; the light-emitting devices of the sixty-first aspect which are placed corresponding to a plurality of pixel areas of the display device which are formed in a matrix of rows and columns by the first lines and the second lines; a voltage control circuit for controlling the voltages of the first lines and the second lines; common power supply lines for supplying driving currents to the light-emitting devices; and thin-film transistors each of which is provided corresponding to each pixel, for receiving a video signal at its gate and controlling the conduction between the common power supply line and the organic electroluminescent device.

BRIEF DESCRIPTION OF THE DRAWINGS

The objects and features of the present invention will become more apparent from the consideration of the following detailed description taken in conjunction with the accompanying drawings, in which.

DESCRIPTION OF THE PREFERRED EMBODIMENTS

Figure 1:
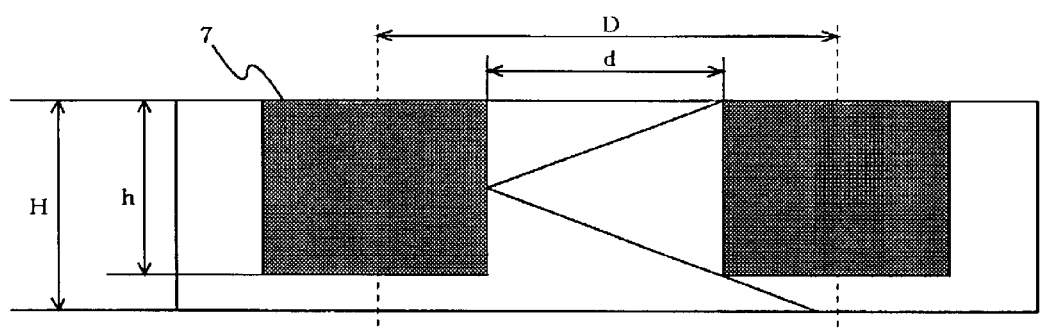
FIG. 1 is a cross-sectional view of a light-emitting device in accordance with the present invention.

Referring now to the drawings, a description will be given in detail of preferred embodiments in accordance with the present invention.

At the outset of the description of the preferred embodiments, principles underlying the present invention will be explained first. In light-emitting devices employing organic EL devices in accordance with the present invention, a substrate having a refractive index that is higher than that of the light-emitting layer of the organic EL device or that is higher than 1.65 is employed as the light-transmitting substrate. In addition to the high refractive index, the light-transmitting substrate is provided with means for reflecting light (reflection means) so that light emitted by an organic EL device (corresponding to a pixel area) will not reach adjacent pixel areas. The present inventors have found out that light-emitting devices capable of eliminating the light leakage problem can be obtained by the employment of such reflection means.

Meanwhile, in other light-emitting devices employing organic EL devices in accordance with the present invention, the high-refractive-index substrate (whose refractive index is higher than that of the light-emitting layer of the organic EL device or higher than 1.65) is further provided with a light-diffusing function at its surface from which light is emitted to the air. The present inventors have found out that light-emitting devices capable of eliminating the light leakage problem and improving the light extraction efficiency can be obtained by the employment of such composition.

In conventional organic EL devices, the light emitted by the light-emitting layer is attenuated by two interfaces: a first interface between the organic EL device and the substrate and a second interface between the substrate and the air, thereby approximately 80% of the light emitted by the light-emitting layer is lost, that is, only approximately 20% of the emitted light can be extracted to outside. If a substrate having a refractive index higher than that of the light-emitting layer or higher than 1.65 is employed as the light-transmitting substrate, the loss of light at the interface between the organic EL device and the substrate can be reduced successfully. However, with the use of the high-refractive-index substrate only, the loss of light at the other interface between the substrate and the air increases and the total light extraction efficiency can not be increased.

However, by providing the light-diffusing function to the substrate-air interface, the rate of light incapable of going out of the substrate to the air decreases due to reflection and diffusion of light at the interface to many directions, thereby, in combination with the reduction of loss at the interface between the organic EL device and the substrate, the light extraction efficiency can be improved markedly.

Incidentally, the improvement of the light extraction efficiency can not be attained only by providing the light-diffusing function to the substrate. When the light-diffusing function is provided to a substrate whose refractive index is lower than 1.65 or lower than that of the light-emitting layer, the rate of light that is confined in the organic EL device remains very high, and thus almost no improvement of the light extraction efficiency can be expected. If anything, the total light extraction efficiency is deteriorated, taking other factors in account.

In addition to the improvement of the light extraction efficiency, the light leakage can be reduced by employing the reflection means for preventing the light from reaching adjacent pixel areas. Further, light that is emitted by an organic EL device to specific angles (with which the light would reach adjacent pixel areas if there is no reflection means) is reflected by the reflection means and bounces back to the pixel area including the organic EL device, thereby the loss of light is also reduced.

As above, for the effective reduction of the light leakage, it is desirable that the light once reflected by the reflection means should not reach adjacent pixel areas. Referring to a cross-sectional view of FIG. 1 (which is taken along a plane that is perpendicular to both the reflecting surface of the reflection means and the surface of the light-transmitting substrate), the reference character "D" denotes the distance between the centers of two reflection means (or two parts of the reflection means) surrounding an organic EL device, and the reference character "d" denotes the distance between two reflecting surfaces (of the two reflection means or the two parts) facing the organic EL device. The ratio between d and D will be described as "t" (t=d/D). The reference character "h" denotes the height of the reflection means (measured from a contacting surface of the light-transmitting substrate with a first electrode). The reference character "H" denotes the distance between the contacting surface (of the light-transmitting substrate with the first electrode) and another surface (light-emitting surface) of the light-transmitting substrate from which light is emitted to the air (i.e. the aforementioned interface between the substrate and the air).

Considering the relationships among the optical path length along the substrate plane (i.e. the length of the projection of the optical path on the substrate plane) and the distances D and d, the following equation (1) holds.

$$\frac{2Hd}{h} \leq \frac{D-d}{2} + 2d \qquad (1)$$

From the equation (1), it is desirable that the height h of the reflection means be set to $H \cdot 4t/(1+3t)$ or more.

Meanwhile, if the surface of the high-refractive-index substrate from which the light is emitted to the air is an ordinary flat surface, total reflection is caused by the difference of refractive index between the substrate and the air and consequently, the light extraction efficiency can not be improved. On the other hand, by providing the light-diffusing function to the surface (substrate-air interface), the light is repeatedly emitted and reflected to various angles and thereby the rate of light extracted to the outside of the substrate can be increased. Now that the rate of light entering the substrate from the organic EL device could be increased by the use of the high-refractive-index substrate as mentioned before, the total light extraction efficiency can be increased dramatically.

In the following, embodiments in accordance with the present invention will be described in detail referring to figures.

The light-emitting device in accordance with the present invention includes one or more organic layers (including at least a light-emitting layer) which are provided between a first electrode and a second electrode, and there are no particular limitations on the basic structure. One of the two electrodes functions as the anode and the other functions as the cathode. FIGS. 2 through 5 illustrate examples of the basic structure of organic EL devices, assuming that the first electrode and the second electrode are the anode and the cathode respectively.

Figure 2:
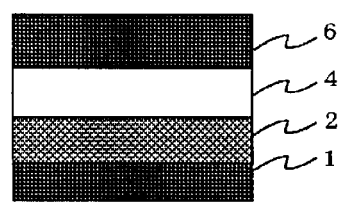
FIG. 2 is a cross-sectional view showing an example of an organic EL device employed for the light-emitting device of the present invention.
Figure 3:
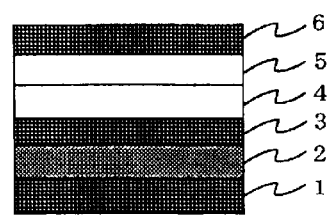
FIG. 3 is a cross-sectional view showing another example of an organic EL device employed for the light-emitting device of the present invention.
Figure 4:
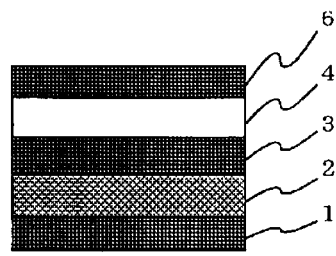
FIG. 4 is a cross-sectional view showing another example of an organic EL device employed for the light-emitting device of the present invention.
Figure 5:
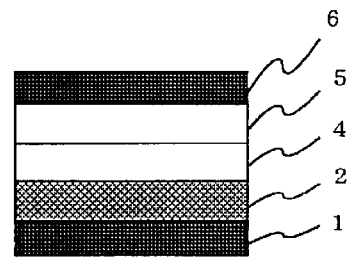
FIG. 5 is a cross-sectional view showing another example of an organic EL device employed for the light-emitting device of the present invention.

From the bottom, the light-emitting device of FIG. 2 includes a light-transmitting substrate 1, a first electrode (anode) 2, a light-emitting layer 4, and a second electrode (cathode) 6. The light-emitting device of FIG. 3 includes a light-transmitting substrate 1, a first electrode 2, a hole transporting layer 3, a light-emitting layer 4, an electron transporting layer 5, and a second electrode 6. The light-emitting device of FIG. 4 includes a light-transmitting substrate 1, a first electrode 2, a hole transporting layer 3, a light-emitting layer 4, and a second electrode 6. The light-emitting device of FIG. 5 includes a light-transmitting substrate 1, a first electrode 2, a light-emitting layer 4, an electron transporting layer 5, and a second electrode 6.

At each interface between organic layers or between an organic layer and an electrode, a thin layer composed of inorganic dielectric materials or insulators (lithium fluoride, magnesium fluoride, silicon monoxide, silicon dioxide, silicon nitride, etc.), a mixed layer composed of the mixture of organic material (used in organic layers) and metal (or electrode materials), or a polymeric organic thin layer (polyaniline, polyacetylene derivative, polydiacetylene derivative, polyvinylcarbazole derivative, poly-p-phenylenevinylene derivative, etc.) can be inserted for improving charge injection properties, preventing electrical breakdown or improving luminous efficiency.

Light-emitting materials to be used in the present invention are not particularly limited. Any chemical compound that is generally used as light-emitting material can be employed in the present invention.

[Formula 1]

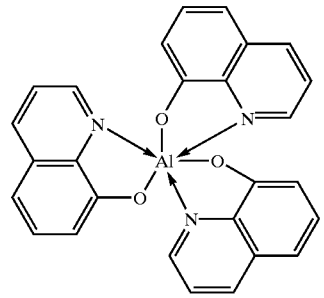

[Formula 2]

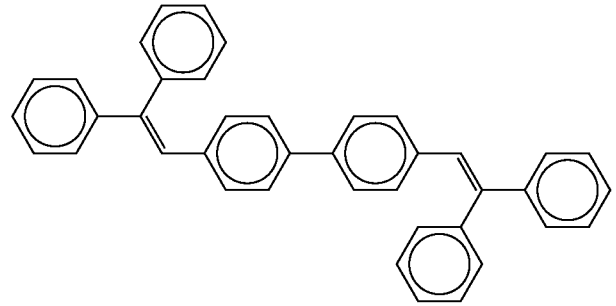

[Formula 3]

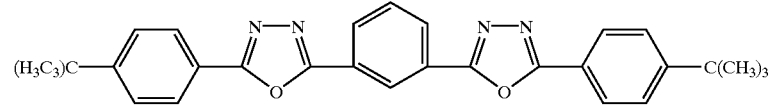

[Formula 4]

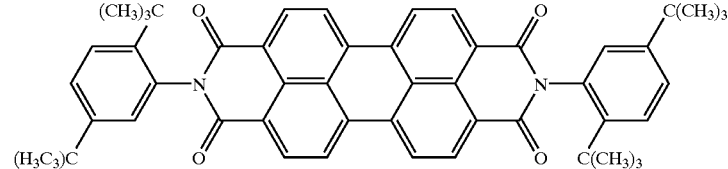

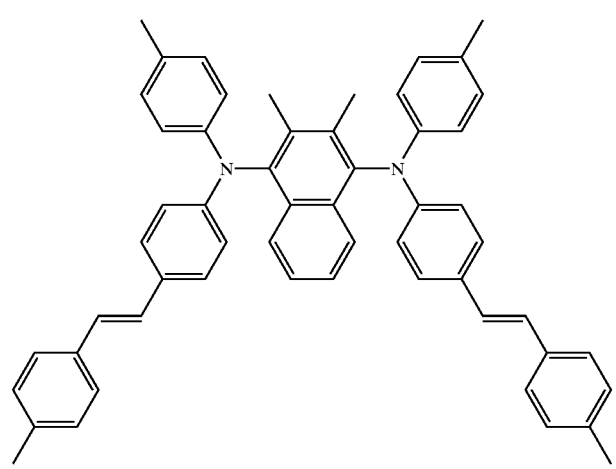

For example, low-molecular light-emitting materials such as the aforementioned tris(8-quinolinol)aluminum complex (Alq3) [Formula 1], bis(diphenylvinyl)biphenyl (BDPVBi) [Formula 2], 1,3-bis(p-t-butylphenyl-1,3,4-oxadiazolyl) phenyl (OXD-7) [Formula 3], N,N'-bis(2,5-di-t-butylphenyl)-3,4,9,10-perylenedicarboxyimide (BPPC) [Formula 4], 1,4-bis(N-p-tolyl-N-4-(4-methylstyryl) phenylamino)naphthalene [Formula 5], etc. can be employed. Polymeric light-emitting materials such as polyphenylenevinylene polymer can also be employed.

As the light-emitting materials, it is also possible to employ charge transporting materials doped with fluorescent materials.

[Formula 6]

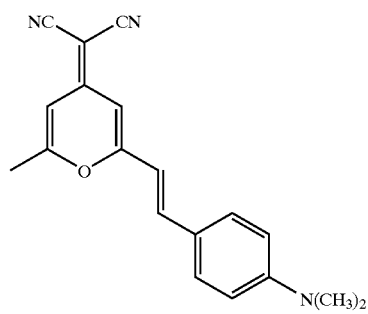

[Formula 7]

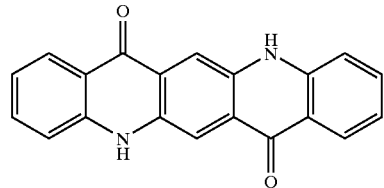

[Formula 8]

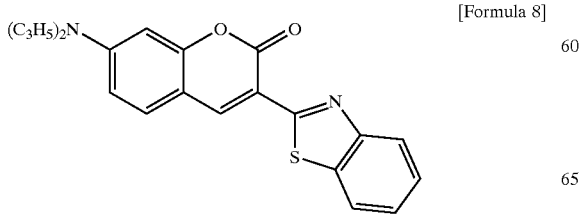

[Formula 9]

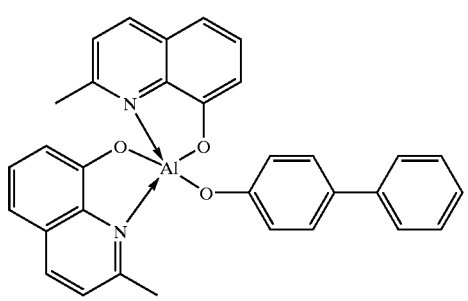

[Formula 10]

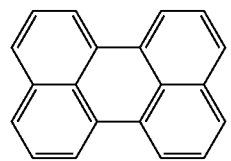

[Formula 11]

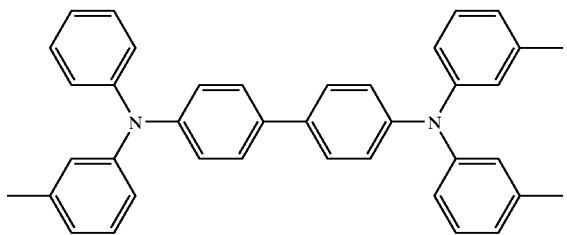

[Formula 12]

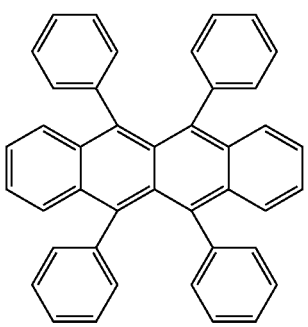

For example, quinolinol-metal complex (such as the aforementioned Alq3 [Formula 1]) doped with 4-dicyanomethylene-2-methyl-6-(p-dimethylaminostyryl)-4H-pyrane (DCM) [Formula 6], quinolinol-metal complex doped with quinacridone derivatives such as 2,3-quinacridone [Formula 7], and quinolinol-metal complex doped with coumarin derivatives such as 3-(2'-benzothiazole)-7-diethylaminocoumarin [Formula 8] can be employed. Examples further include: electron transporting material bis(2-methyl-8-hydroxyquinoline)-4-phenylphenol-aluminum complex [Formula 9] doped with condensed polycyclic aromatic compound such as perylene [Formula 10]; and hole transporting material 4,4'-bis(m-tolylphenylamino)biphenyl (TPD) [Formula 11] doped with rubrene [Formula 12].

Hole transporting materials to be used in the present invention are not particularly limited. Any chemical compound that is generally used as hole transporting material can be employed in the present invention.

[Formula 16]

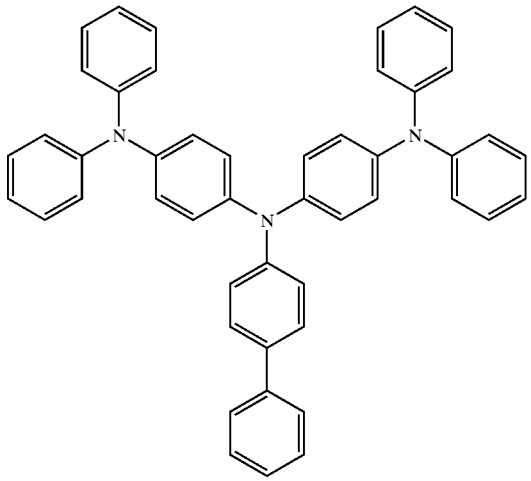

[Formula 13]

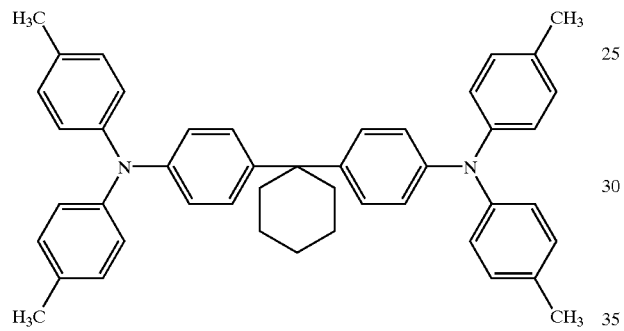

[Formula 17]

[Formula 14]

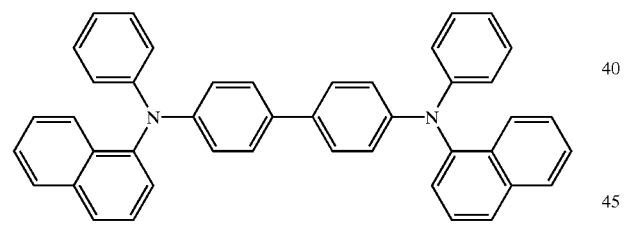

[Formula 15]

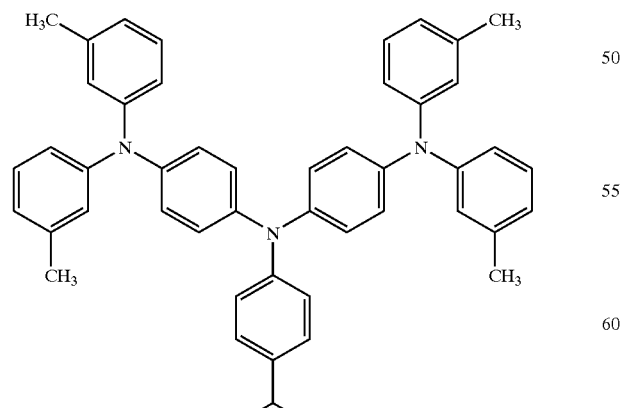

For example, triphenyldiamines such as bis(di(p-tolyl)aminophenyl)-1,1-cyclohexane [Formula 13], TPD [Formula 11] and N,N'-diphenyl-N,N'-bis(1-naphthyl)-1,1'-biphenyl)-4,4'-diamine (NPB) [Formula 14]; and star-burst type amines ([Formula 15]–[Formula 17]) can be employed.

Electron transporting materials to be used in the present invention are not particularly limited. Any chemical compound that is generally used as electron transporting material can be employed in the present invention.

[Formula 18]

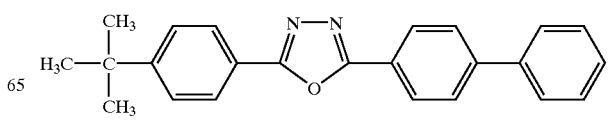

[Formula 19]

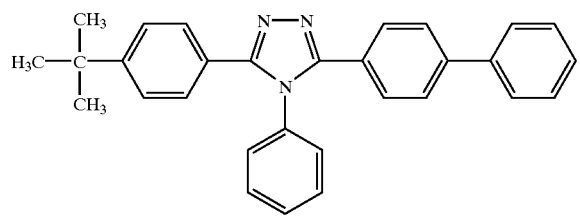

[Formula 20]

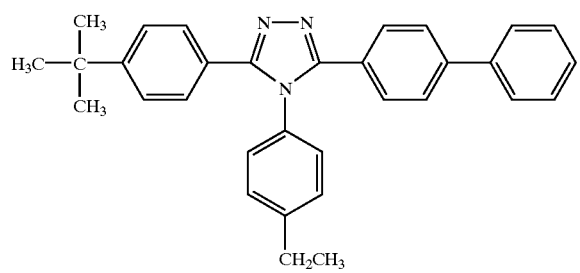

[Formula 21]

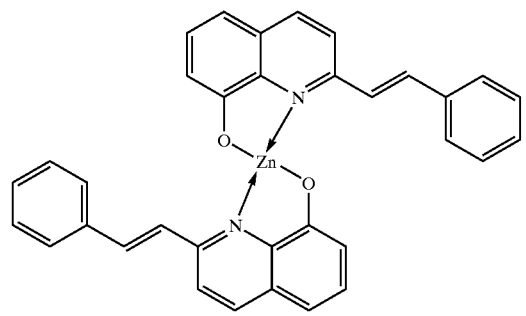

[Formula 22]

[Formula 23]

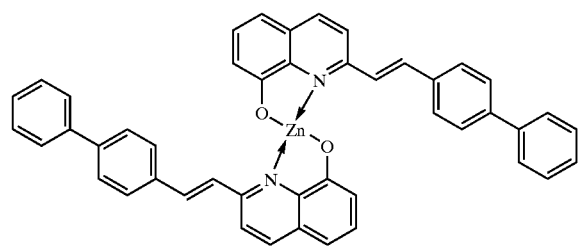

[Formula 24]

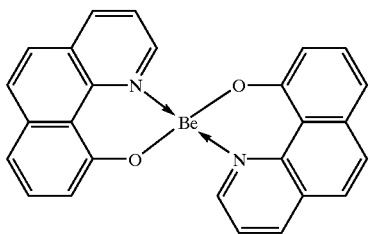

For example, oxadiazole derivatives such as 2-(4-biphenylyl)-5-(4-t-butylphenyl)-1,3,4-oxadiazole (Bu-PBD) [Formula 18] and OXD-7 [Formula 3]; triazole derivatives ([Formula 19], [Formula 20], etc.); and quinolinol-metal complexes ([Formula 1], [Formula 9], [Formula 21]–[Formula 24]) can be employed.

The anode of the organic thin-film EL device has the function of injecting holes into the hole transporting layer or light emitting layer, therefore, the anode functions efficiently if its work function is 4.5 eV or more. As the material of the anode, ITO (Indium Tin Oxide), tin oxide (NESA), gold, silver, platinum, copper, etc. can be used.

The cathode of the organic thin-film EL device has the function of injecting electrons into the electron transporting layer or light emitting layer, therefore, it is preferable that the cathode has a small work function. The material of the cathode is not particularly limited. Specifically, indium, aluminum, magnesium, magnesium-indium alloy, magnesium-aluminum alloy, aluminum-lithium alloy, aluminum-scandium-lithium alloy, magnesium-silver alloy, etc. can be used.

Methods for fabricating each layer of the light-emitting device in accordance with the present invention are not particularly limited. Well known methods such as vacuum deposition and spin coating can be employed. The organic thin layers employed in the organic EL device of the present invention containing the aforementioned chemical compounds can be formed by conventional methods such as vacuum deposition and molecular beam epitaxy (MBE), or by conventional methods for coating a solution (solvent) containing the chemical compounds, such as dipping, spin coating, casting, bar coating and roll coating.

The thicknesses of the light-emitting layer, the hole transporting layer and the electron transporting layer of the light-emitting device are not particularly limited, however, too small thickness causes defects such as pinholes. On the other hand, if the thickness is too large, high applied voltage is necessary and thereby power efficiency gets worse. Therefore, preferable thickness is several nm to 1 $\mu$m.

The light-transmitting substrate employed in the present invention has a refractive index larger than that of the light-emitting layer or larger than 1.65. Examples of materials of such light-transmitting substrate include: high-refractive-index optical glass such as FD-11, LaK3, BaF10, LaF2, SF13 and SFS1; sapphire glass; titania glass; inorganic materials such as ZnSe; and sulfur-containing resins such as polyethersulfone (PES)-based resin.

The light-transmitting substrate employed in the present invention can be provided with the light-diffusing function on its surface opposite to the first electrode, or a second light-transmitting substrate composed of the aforementioned materials and having the light-diffusing function can be provided to the surface of the light-transmitting substrate opposite to the first electrode, thereby the light extraction efficiency of the light-emitting device can be improved.

The light-diffusing means can be formed by: providing roughness (concavities and convexities) to the light-emitting surface of the substrate; arranging light-transmitting minute balls, fibers, or cylindrical lenses made of material (light-transmitting resin, low-refractive-index glass, etc.) having a refractive index that is different from that of the substrate material on the light-emitting surface of the substrate; etc.

The aforementioned second light-transmitting substrate can be formed of any material that can be used for the light-transmitting substrate. Especially, a combination of a light-transmitting substrate and a second light-transmitting substrate whose refractive index is higher than that of the (first) light-transmitting substrate is preferable.

When a substrate that is made of resin is used for the second light-transmitting substrate, there is a possibility that gas passing through the resin substrate intrudes the (first) light-transmitting substrate and gives inferior characteristics to the organic EL device. However, such ill effects to the organic EL device can be eliminated by providing a gas barrier layer between the light-transmitting substrate and the second light-transmitting substrate. Materials having gas barrier properties against $H_2O$ and oxygen are effective for the gas barrier layer. A thin layer of $SiO_2$, $SiN_x$, $SiO_xN_y$, etc. formed by a conventional method (sputtering etc.) can be employed as the gas barrier layer.

It is also possible and effective to provide a third light-transmitting substrate between the gas barrier layer and the light-transmitting substrate in order to improve the adhesion between the gas barrier layer and the light-transmitting substrate. The third light-transmitting substrate can be formed of the materials for the light-transmitting substrate.

The reflection means employed in the present invention can be formed by anything that is capable of reflecting the light (which is emitted by the light-emitting layer and led to the light-transmitting substrate) and thereby preventing the light from reaching adjacent pixel areas. For example, wall-like implants (made of material whose refractive index is lower than that of the light-transmitting substrate) embedded in the light-transmitting substrate, mirrors (metal capable of reflecting the light emitted by the light-emitting layer) embedded in the light-transmitting substrate, etc. can be employed as the reflection means.

As mentioned before referring to FIG. 1, in order to eliminate the light leakage more effectively, in the cross section taken along a plane perpendicular to both the reflecting surface of the reflection means and the surface of the light-transmitting substrate, it is preferable that the height h of the reflection means (measured from the contacting surface of the light-transmitting substrate with the first electrode) be set to H·4t/(1+3t) or more (where t=d/D, D: the distance between the centers of two reflection means surrounding an organic EL device, d: the distance between two reflecting surfaces of the two reflection means facing the organic EL device, H: the distance between the contacting surface (of the light-transmitting substrate with the first electrode) and the light-emitting surface of the light-transmitting substrate).

In the case where the reflection means in accordance with the present invention is formed by metal embedded in the substrate, the reflection means can be formed so as to be extended and electrically connected in a proper direction and also be connected with the first electrode(s). By such structure of the reflection means, the reflection means can also function as an assist electrode for the first electrode(s). By the assist electrode function of the reflection means, the resistance of the first electrode can be reduced and thereby the total power consumption of the light-emitting devices can be reduced considerably.

As the metal to be used for the formation of the reflection means, any metal or alloy that is capable of reflecting the light emitted by the organic EL device can be employed. However, in the case where the metal part (reflection means) is electrically connected with the first electrode and the anode of the organic EL device is formed by the (light-transmitting) first electrode, if metal capable of injecting holes into the organic thin layers of the organic EL device (gold, silver, etc.) is employed for the metal part, it is necessary to provide an electrical insulator between the metal part and the organic thin layers.

That requires extra processes and causes high cost. Therefore, it is preferable that the metal to be used for the reflection means should have a work function of 4.3 eV of less, by which hole injection to the organic thin layer becomes impossible. Such metals include: indium, aluminum, magnesium, magnesium-indium alloy, magnesium-aluminum alloy, aluminum-lithium alloy, aluminum-scandium-lithium alloy, magnesium-silver alloy, etc.

In the following, the present invention will be described in detail with reference to some illustrative embodiments, however, it is to be appreciated that the spirit and scope of the present invention is not to be restricted by the particular illustrative embodiments.

[Embodiment 1]

Figure 6:
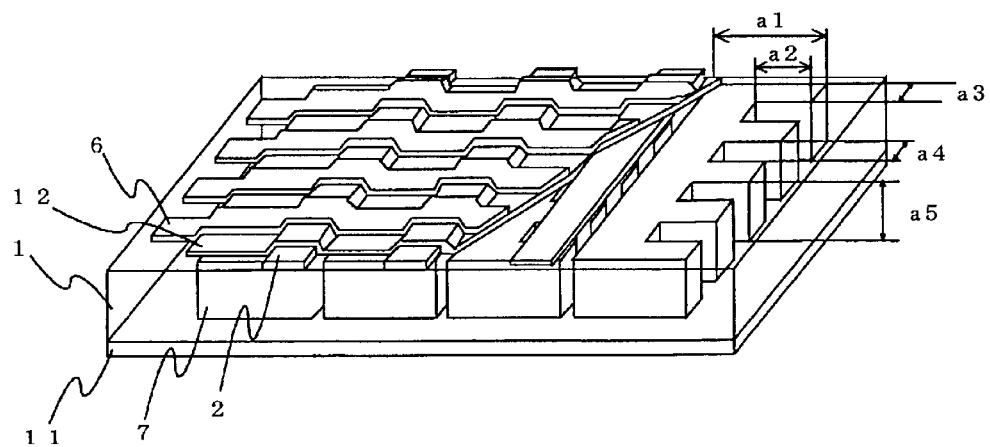
FIG. 6 is a partly broken perspective view of a light-emitting device in accordance with a first embodiment of the present invention.
Figure 7:
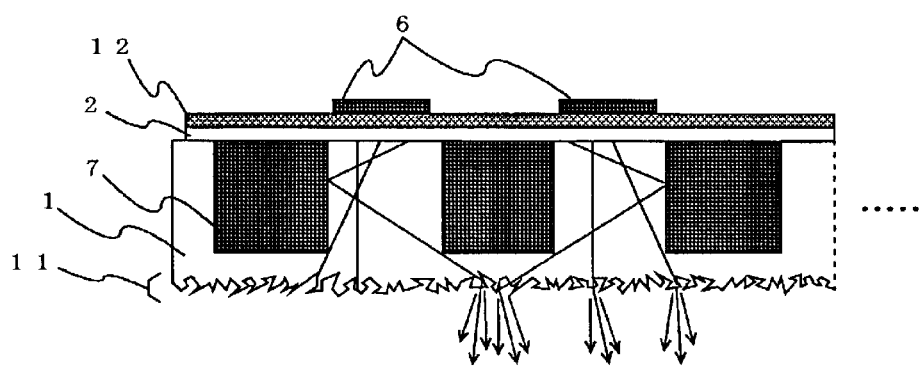
FIG. 7 is a vertical sectional view of the light-emitting device of FIG. 6.

FIGS. 6 and 7 illustrate a light-emitting device in accordance with a first embodiment of the present invention. FIG. 6 is a partly broken perspective view of the light-emitting device of the first embodiment, in which the second electrode 6 and the organic layer 12 are partly and obliquely broken. FIG. 7 is a vertical sectional view of the light-emitting device of FIG. 6. Referring to FIG. 6, combshaped metal parts (reflection means) 7 made of magnesium-silver alloy were placed in a substrate formation frame (a frame used for the formation of the substrate) and arranged in the same direction at intervals of 200 μm so as not to touch each other. Dimensions of the combshaped metal part 7 were: a1=190 μm, a2=90 μm, a3=a4=100 μm, and a5=480 μm.

A tetrahydrofuran solution of PES-based resin was calmly poured into the above structure and thereafter the solvent was vaporized, thereby a light-transmitting substrate 1 of 500 μm thick was formed. A light-diffusing part 11 was formed on the upper surface of the light-transmitting substrate 1 by roughening the upper surface, and the light-transmitting substrate 1 was removed out of the substrate formation frame. On the other surface of the light-transmitting substrate 1 (which was in contact with the bottom of the substrate formation frame), the first electrodes 2 were formed by sputtering ITO on the surface in the shape of stripes (width: 80 μm, interval: 120 μm) so as to cover the teeth of the combshaped metal parts 7 and to have a sheet resistance of 20 Ω/□.

On the structure, the compound of [Formula 14] was deposited by vacuum deposition to form the hole transporting layer 3 having a film thickness of 20 nm, and the compound of [Formula 1] was deposited thereon by vacuum deposition to form the light-emitting layer 4 having a film thickness of 50 nm.

Subsequently, the compound of [Formula 18] was deposited by vacuum deposition to form the electron transporting layer 5 having a film thickness of 20 nm. In FIGS. 6 and 7, the hole transporting layer 3, the light-emitting layer 4 and the electron transporting layer 5 are summarized as an "organic layer 12".

Subsequently, the second electrodes 6 having a film thickness of 200 nm were formed by depositing magnesium-silver alloy by vacuum deposition using a mask. The second electrodes 6 were formed in the shape of stripes (width: 80 μm, interval: 120 μm) covering the gaps between the teeth of the combshaped metal parts 7 so as to be orthogonal to the stripes of the first electrodes 2, thereby the light-emitting device of the first embodiment was completed. When DC voltage of 10 V was successively applied to each element of the light-emitting device, luminescence of 14000 cd/m$^2$ with no light leakage could be obtained.

[Embodiment 2]

Figure 8:
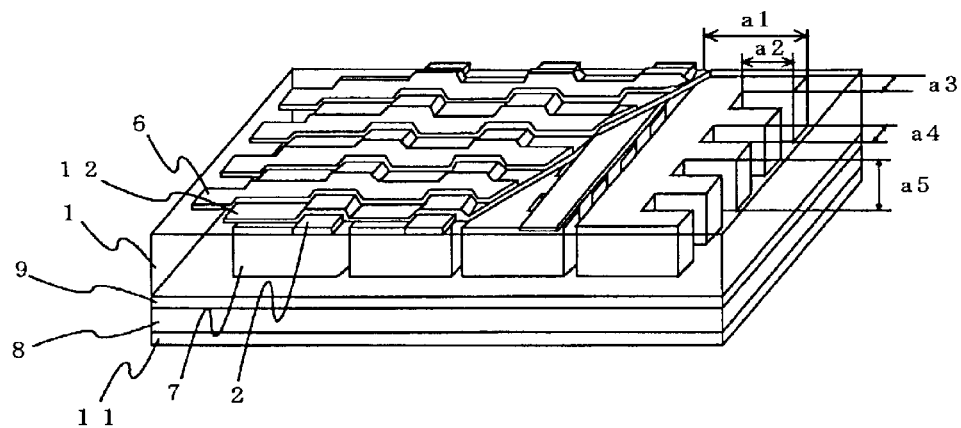
FIG. 8 is a partly broken perspective view of a light-emitting device in accordance with a second embodiment of the present invention.

FIG. 8 is a partly broken perspective view showing a light-emitting device in accordance with a second embodiment of the present invention, in which the second electrode 6 and the organic layer 12 are partly and obliquely broken. In the second embodiment, instead of the roughening of the upper surface of the light-transmitting substrate 1 in the substrate formation frame, a second light-transmitting substrate 8 of PES-based resin (thickness: 100 μm), having a first surface which had been roughened and a second surface on which SiO2 had been sputtered to a thickness of 200 nm as a gas barrier layer 9, was attached to the light-transmitting substrate 1, letting the gas barrier layer 9 touch the upper surface of the light-transmitting substrate 1. The other steps were conducted similarly to the first embodiment and thereby the light-emitting device of the second embodiment was fabricated. When DC voltage of 10 V was successively applied to each element of the light-emitting device, luminescence of 13000 cd/m$^2$ with no light leakage could be obtained.

[Embodiment 3]

Figure 9:
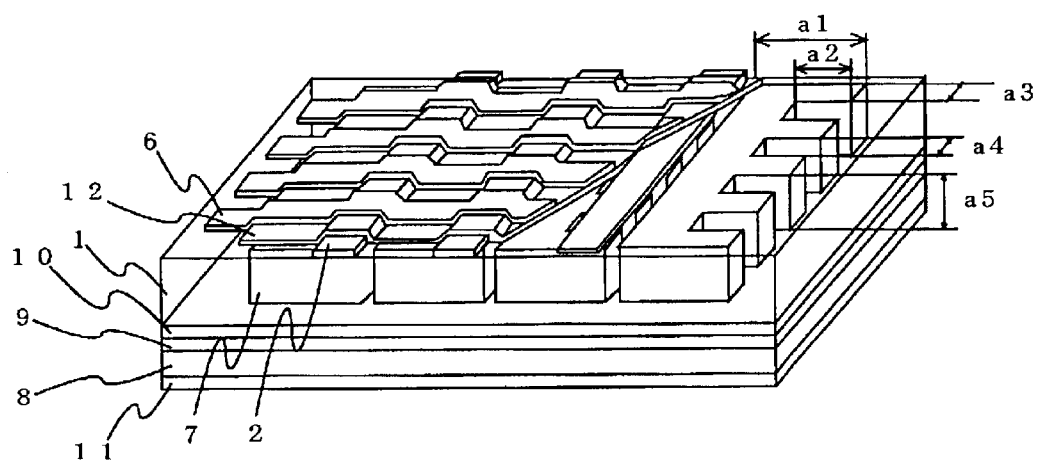
FIG. 9 is a partly broken perspective view of a light-emitting device in accordance with a third embodiment of the present invention.

FIG. 9 is a partly broken perspective view showing a light-emitting device in accordance with a third embodiment of the present invention, in which the second electrode 6 and the organic layer 12 are partly and obliquely broken. In the third embodiment, the thickness of the second light-transmitting substrate 8 of the second embodiment was reduced to 80 μm, a third light-transmitting substrate 10 (thickness: 18 μm) made of PES-based resin was attached to the gas barrier layer 9 of the second light-transmitting substrate 8, and the third light-transmitting substrate 10 was attached to the upper surface of the light-transmitting substrate 1 in the substrate formation frame. The other steps were conducted similarly to the second embodiment, thereby the light-emitting device of the third embodiment was fabricated. When DC voltage of 10 V was successively applied to each element of the light-emitting device, luminescence of 13700 cd/m$^2$ with no light leakage could be obtained.

[Embodiment 4]

Figure 10:
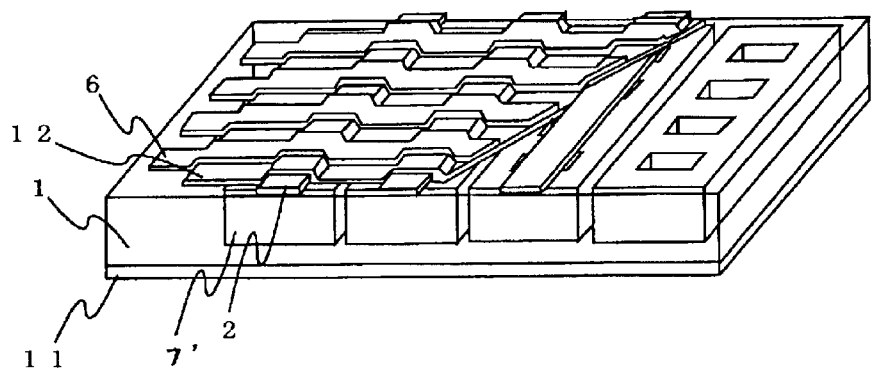
FIG. 10 is a partly broken perspective view of a light-emitting device in accordance with a fourth embodiment of the present invention.
Figure 11:
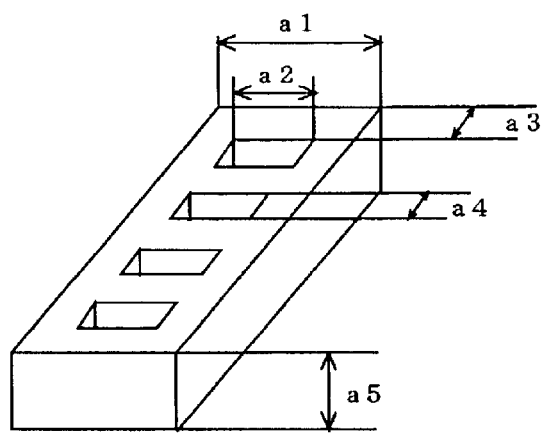
FIG. 11 is a perspective view showing the structure of a metal part having through-holes which is employed in the light-emitting device of FIG. 10.

FIG. 10 is a partly broken perspective view showing a light-emitting device in accordance with a fourth embodiment of the present invention, in which the second electrode 6 and the organic layer 12 are partly and obliquely broken. In the fourth embodiment, metal parts as reflection means were formed in a different shape in comparison with the first embodiment. Metal parts (reflection means) 7' made of magnesium-silver alloy and having through-holes were placed in the substrate formation frame and arranged in the same direction at intervals of 200 μm so as not to touch each other. The structure of the metal part 7' having through-holes is shown in FIG. 11. Dimensions of the metal part 7' were: a1=190 μm, a2=90 μm, a3=a4=100 μm, and a5=480 μm.

A tetrahydrofuran solution of PES-based resin was calmly poured into the above structure and thereafter the solvent was vaporized, thereby a light-transmitting substrate 1 of 500 μm thick was formed. A light-diffusing part 11 was formed on the upper surface of the light-transmitting substrate 1 by roughening the upper surface, and the light-transmitting substrate 1 was removed out of the substrate formation frame. On the other surface of the light-transmitting substrate 1 (which was in contact with the bottom of the substrate formation frame), the first electrodes 2 were formed by sputtering ITO on the surface in the shape of stripes (width: 80 μm, interval: 120 μm) so as to cover the through-holes of the metal parts 7' and to have a sheet resistance of 20 Ω/□.

On the structure, the compound of [Formula 14] was deposited by vacuum deposition to form the hole transporting layer 3 having a film thickness of 20 nm, and the compound of [Formula 1] was deposited thereon by vacuum deposition to form the light-emitting layer 4 having a film thickness of 50 nm.

Subsequently, the compound of [Formula 18] was deposited by vacuum deposition to form the electron transporting layer 5 having a film thickness of 20 nm. In FIG. 10, the hole transporting layer 3, the light-emitting layer 4 and the electron transporting layer 5 are summarized as an "organic layer 12".

Subsequently, the second electrodes 6 were formed by depositing magnesium-silver alloy to a thickness of 200 nm by means of vacuum deposition using a mask. The second electrodes 6 were formed in the shape of stripes (width: 80 μm, interval: 120 μm) covering the through-holes of the metal parts 7' so as to be orthogonal to the stripes of the first electrodes 2, thereby the light-emitting device of the fourth embodiment was completed. When DC voltage of 10 V was successively applied to each element of the light-emitting device, luminescence of 14500 cd/m$^2$ with no light leakage could be obtained.

[Embodiment 5]

Figure 12:
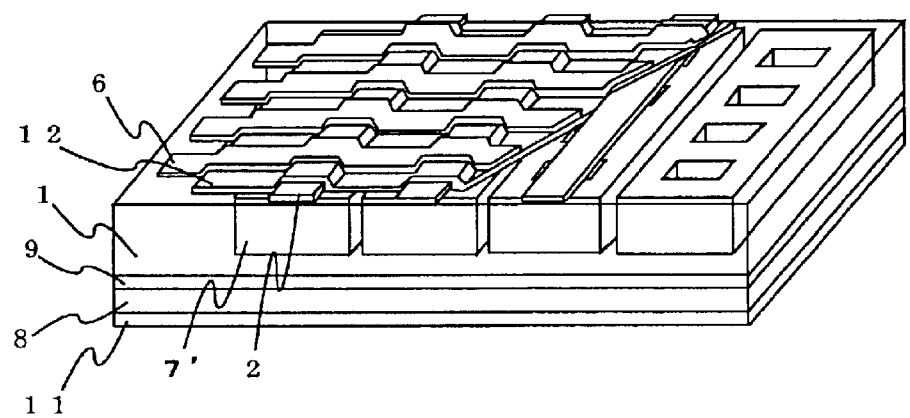
FIG. 12 is a partly broken perspective view of a light-emitting device in accordance with a fifth embodiment of the present invention.

FIG. 12 is a partly broken perspective view showing a light-emitting device in accordance with a fifth embodiment of the present invention, in which the second electrode 6 and the organic layer 12 are partly and obliquely broken. In the fifth embodiment, instead of the roughening of the upper surface of the light-transmitting substrate 1 in the substrate formation frame, a second light-transmitting substrate 8 of PES-based resin (thickness: 100 μm), having a first surface which had been roughened and a second surface on which SiO2 had been sputtered to a thickness of 200 nm as a gas barrier layer 9, was attached to the light-transmitting substrate 1, letting the gas barrier layer 9 touch the upper surface of the light-transmitting substrate 1. The other steps were conducted similarly to the fourth embodiment and thereby the light-emitting device of the fifth embodiment was fabricated. When DC voltage of 10 V was successively applied to each element of the light-emitting device, luminescence of 12900 cd/m$^2$ with no light leakage could be obtained.

[Embodiment 6]

Figure 13:
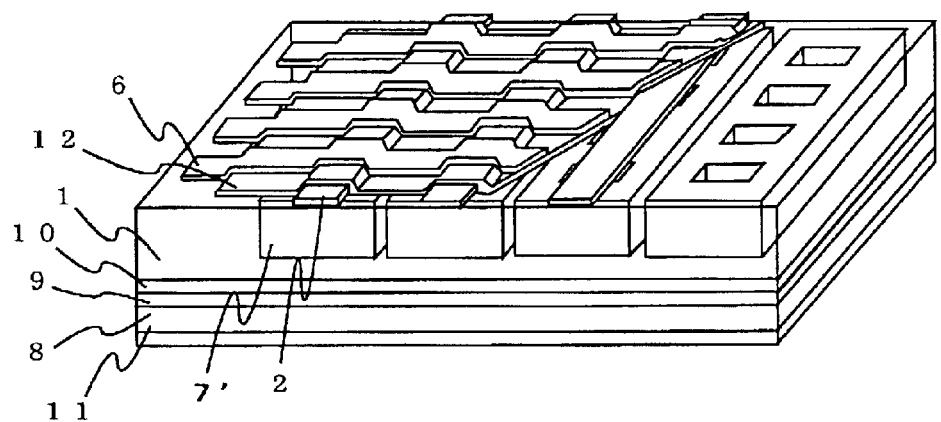
FIG. 13 is a partly broken perspective view of a light-emitting device in accordance with a sixth embodiment of the present invention.

FIG. 13 is a partly broken perspective view showing a light-emitting device in accordance with a sixth embodiment of the present invention, in which the second electrode 6 and the organic layer 12 are partly and obliquely broken. In the sixth embodiment, the thickness of the second light-transmitting substrate 8 of the fifth embodiment was reduced to 80 μm, a third light-transmitting substrate 10 (thickness: 18 μm) made of PES-based resin was attached to the gas barrier layer 9 of the second light-transmitting substrate 8, and the third light-transmitting substrate 10 was attached to the upper surface of the light-transmitting substrate 1 in the substrate formation frame. The other steps were conducted similarly to the fifth embodiment, thereby the light-emitting device of the sixth embodiment was fabricated. When DC voltage of 10 V was successively applied to each element of the light-emitting device, luminescence of 13500 cd/m² with no light leakage could be obtained.

Figure 14:
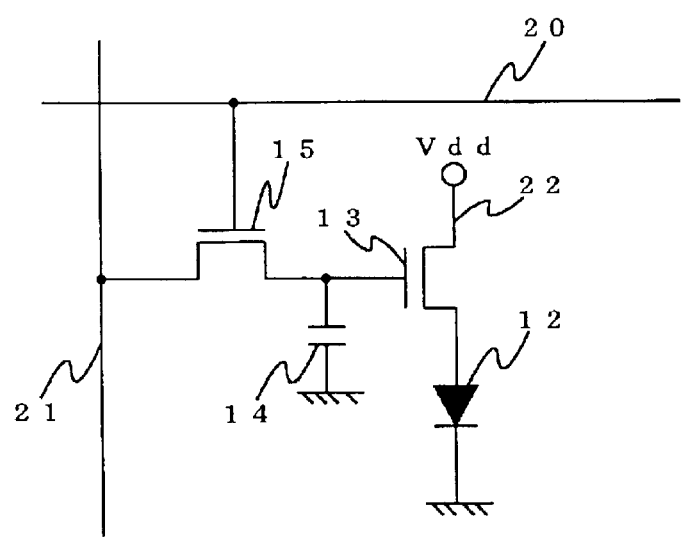
FIG. 14 is a circuit diagram showing a driving circuit employed in the light-emitting device of the present invention.

In the following, a display device employing the light-emitting devices which have been described above will be explained. As shown in FIG. 14, a driving circuit including: a TFT (Thin-Film Transistor) 13 for supplying an electric current to a light-emitting part (organic EL device 12); a capacitor 14 for storing a video signal; and a switching transistor 15 for controlling the storage of electrical charge in the capacitor 14, are provided to each pixel (light-emitting element) of the light-emitting device of the present invention.

By applying a voltage to the horizontal line 20 shown in FIG. 14, the voltage is applied to the gate of the switching transistor 15 and thereby the source and drain of the switching transistor 15 become electrically continuous. In this state, electrical charge can be stored in the capacitor 14 by applying a voltage to the vertical line 21 shown in FIG. 14. Due to the electrical charge stored in the capacitor 14, a voltage is applied to the gate of the TFT 13 and the gate is brought into conduction, thereby power is supplied to the light-emitting part (organic EL device 12).

An active matrix display device can be built up by arranging the above light-emitting units in a regular matrix of rows and columns. An unshown voltage control circuit, to which the horizontal lines 20 and the vertical lines 21 are connected, calculates light-emitting time for each pixel based on the video signal, determines voltage, time and timing for each signal to be applied to the horizontal lines 20 and the vertical lines 21, and thereby drives the light-emitting devices (light-emitting units) of the active matrix display device.

As set forth hereinabove, by the present invention, a light-emitting device employing an organic EL device with no light leakage and excellent light extraction efficiency can be realized and thereby a high-intensity low-voltage-driven display device can be realized.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A light-emitting device comprising an organic electroluminescent device including one or more organic thin layers at least including a light-emitting layer which are sandwiched between a transparent first electrode formed on a light-transmitting substrate and a second electrode, wherein:
    the light-transmitting substrate at least includes reflection means for reflecting light emitted by the organic electroluminescent device corresponding to a pixel and thereby preventing the light from entering adjacent pixel areas, and
    the light-transmitting substrate has a refractive index of 1.65 or more.

2. A light-emitting device as claimed in claim 1, wherein in a cross section taken along a plane perpendicular to both a reflecting surface of the reflection means and the light-transmitting substrate, the height h of the reflection means measured from a contacting surface of the light-transmitting substrate with the first electrode is set so as to satisfy:

$$h \geq H \cdot 4t/(1+3t)$$

where:
    t=d/D,
    D: the distance between the centers of two reflection means surrounding the organic electroluminescent device,
    d: the distance between two reflecting surfaces of the two reflection means facing the organic electroluminescent device, and
    H: the distance between the contacting surface and an opposite surface of the light-transmitting substrate.

3. A light-emitting device as claimed in claim 1, wherein a surface of the light-transmitting substrate opposite to the first electrode is provided with light-diffusing means for diffusing the light emitted by the organic electroluminescent device.

4. A light-emitting device as claimed in claim 3, wherein in a cross section taken along a plane perpendicular to both a reflecting surface of the reflection means and the light-transmitting substrate, the height h of the reflection means measured from a contacting surface of the light-transmitting substrate with the first electrode is set so as to satisfy:

$$h \geq H \cdot 4t/(1+3t)$$

where:
    t=d/D,
    D: the distance between the centers of two reflection means surrounding the organic electroluminescent device,
    d: the distance between two reflecting surfaces of the two reflection means facing the organic electroluminescent device, and
    H: the distance between the contacting surface and an opposite surface of the light-transmitting substrate.

5. A light-emitting device as claimed in claim 1, wherein a surface of the light-transmitting substrate opposite to the first electrode is provided with a second light-transmitting substrate having a refractive index of 1.65 or more and having light-diffusing means for diffusing the light emitted by the organic electroluminescent device on its surface opposite to the light-transmitting substrate.

6. A light-emitting device as claimed in claim 5, wherein the refractive index of the second light-transmitting substrate is set higher than that of the light-transmitting substrate.

7. A light-emitting device as claimed in claim 5, wherein the light-transmitting substrate and the second light-transmitting substrate are formed of resin.

8. A light-emitting device as claimed in claim 7, further comprising a gas barrier layer which is provided between the light-transmitting substrate and the second light-transmitting substrate.

9. A light-emitting device as claimed in claim 8, wherein the gas barrier layer is formed of material having gas barrier properties against $H_2O$ and/or oxygen.

10. A light-emitting device as claimed in claim 8, further comprising a third light-transmitting substrate having a refractive index of 1.65 or more which is provided between the gas barrier layer and the light-transmitting substrate.

11. A light-emitting device as claimed in claim 1, wherein the reflection means is formed by metal that is embedded in the light-transmitting substrate.

12. A light-emitting device as claimed in claim 11, wherein metal whose work function is 4.3 eV or less is employed as the metal embedded in the light-transmitting substrate.

13. A light-emitting device as claimed in claim 11, wherein the metal embedded in the light-transmitting substrate is formed so as to function also as an assist electrode for the first electrode.

14. A light-emitting device as claimed in claim 13, wherein metal whose work function is 4.3 eV or less is employed as the metal embedded in the light-transmitting substrate.

15. A display device comprising:

a plurality of first lines arranged in the same direction;

a plurality of second lines arranged perpendicular to the first lines;

the light-emitting devices of claim 1 which are placed corresponding to a plurality of pixel areas of the display device which are formed in a matrix of rows and columns by the first lines and the second lines;

a voltage control circuit for controlling the voltages of the first lines and the second lines;

common power supply lines for supplying driving currents to the light-emitting devices; and thin-film transistors each of which is provided corresponding to each pixel, for receiving a video signal at its gate and controlling the conduction between the common power supply line and the organic electroluminescent device.

16. A display device as claimed in claim 15, wherein:

the reflection means of the light-emitting devices are implemented by arranging a plurality of combshaped metal parts, and each of the combshaped metal parts is formed so as to function also as an assist electrode for the first electrode.

17. A display device as claimed in claim 15, wherein:

the reflection means of the light-emitting devices are implemented by arranging a plurality of metal parts having through-holes, and each of the metal parts having the through-holes is formed so as to function also as an assist electrode for the first electrode.

18. A display device comprising:

a plurality of first lines arranged in the same direction;

a plurality of second lines arranged perpendicular to the first lines;

the light-emitting devices of claim 2 which are placed corresponding to a plurality of pixel areas of the display device which are formed in a matrix of rows and columns by the first lines and the second lines;

a voltage control circuit for controlling the voltages of the first lines and the second lines;

common power supply lines for supplying driving currents to the light-emitting devices; and thin-film transistors each of which is provided corresponding to each pixel, for receiving a video signal at its gate and controlling the conduction between the common power supply line and the organic electroluminescent device.

19. A display device as claimed in claim 18, wherein:

the reflection means of the light-emitting devices are implemented by arranging a plurality of combshaped metal parts, and each of the combshaped metal parts is formed so as to function also as an assist electrode for the first electrode.

20. A display device as claimed in claim 18, wherein:

the reflection means of the light-emitting devices are implemented by arranging a plurality of metal parts having through-holes, and each of the metal parts having the through-holes is formed so as to function also as an assist electrode for the first electrode.

21. A display device comprising:

a plurality of first lines arranged in the same direction;

a plurality of second lines arranged perpendicular to the first lines;

the light-emitting devices of claim 3 which are placed corresponding to a plurality of pixel areas of the display device which are formed in a matrix of rows and columns by the first lines and the second lines;

a voltage control circuit for controlling the voltages of the first lines and the second lines;

common power supply lines for supplying driving currents to the light-emitting devices; and thin-film transistors each of which is provided corresponding to each pixel, for receiving a video signal at its gate and controlling the conduction between the common power supply line and the organic electroluminescent device.

22. A display device as claimed in claim 21, wherein:

the reflection means of the light-emitting devices are implemented by arranging a plurality of combshaped metal parts, and each of the combshaped metal parts is formed so as to function also as an assist electrode for the first electrode.

23. A display device as claimed in claim 21, wherein:

the reflection means of the light-emitting devices are implemented by arranging a plurality of metal parts having through-holes, and each of the metal parts having the through-holes is formed so as to function also as an assist electrode for the first electrode.

24. A display device comprising:

a plurality of first lines arranged in the same direction;

a plurality of second lines arranged perpendicular to the first lines;

the light-emitting devices of claim 4 which are placed corresponding to a plurality of pixel areas of the display device which are formed in a matrix of rows and columns by the first lines and the second lines;

a voltage control circuit for controlling the voltages of the first lines and the second lines;

common power supply lines for supplying driving currents to the light-emitting devices; and thin-film transistors each of which is provided corresponding to each pixel, for receiving a video signal at its gate and controlling the conduction between the common power supply line and the organic electroluminescent device.

25. A display device as claimed in claim 24, wherein:

the reflection means of the light-emitting devices are implemented by arranging a plurality of combshaped metal parts, and each of the combshaped metal parts is formed so as to function also as an assist electrode for the first electrode.

26. A display device as claimed in claim 24, wherein:
the reflection means of the light-emitting devices are implemented by arranging a plurality of metal parts having through-holes, and
each of the metal parts having the through-holes is formed so as to function also as an assist electrode for the first electrode.

27. A display device comprising:
a plurality of first lines arranged in the same direction;
a plurality of second lines arranged perpendicular to the first lines;
the light-emitting devices of claim 5 which are placed corresponding to a plurality of pixel areas of the display device which are formed in a matrix of rows and columns by the first lines and the second lines;
a voltage control circuit for controlling the voltages of the first lines and the second lines;
common power supply lines for supplying driving currents to the light-emitting devices; and
thin-film transistors each of which is provided corresponding to each pixel, for receiving a video signal at its gate and controlling the conduction between the common power supply line and the organic electroluminescent device.

28. A display device as claimed in claim 27, wherein:
the reflection means of the light-emitting devices are implemented by arranging a plurality of combshaped metal parts, and
each of the combshaped metal parts is formed so as to function also as an assist electrode for the first electrode.

29. A display device as claimed in claim 27, wherein:
the reflection means of the light-emitting devices are implemented by arranging a plurality of metal parts having through-holes, and
each of the metal parts having the through-holes is formed so as to function also as an assist electrode for the first electrode.

30. A light-emitting device comprising an organic electroluminescent device including one or more organic thin layers at least including a light-emitting layer which are sandwiched between a transparent first electrode formed on a light-transmitting substrate and a second electrode, wherein:
the light-transmitting substrate at least includes reflection means for reflecting light emitted by the organic electroluminescent device corresponding to a pixel and thereby preventing the light from entering adjacent pixel areas, and
the light-transmitting substrate has a refractive index higher than that of the light-emitting layer.

31. A light-emitting device as claimed in claim 30, wherein in a cross section taken along a plane perpendicular to both a reflecting surface of the reflection means and the light-transmitting substrate, the height h of the reflection means measured from a contacting surface of the light-transmitting substrate with the first electrode is set so as to satisfy:

$$h \geq H \cdot 4t/(1+3t)$$

where:
t=d/D,
D: the distance between the centers of two reflection means surrounding the organic electroluminescent device,
d: the distance between two reflecting surfaces of the two reflection means facing the organic electroluminescent device, and
H: the distance between the contacting surface and an opposite surface of the light-transmitting substrate.

32. A light-emitting device as claimed in claim 30, wherein a surface of the light-transmitting substrate opposite to the first electrode is provided with light-diffusing means for diffusing the light emitted by the organic electroluminescent device.

33. A light-emitting device as claimed in claim 32, wherein in a cross section taken along a plane perpendicular to both a reflecting surface of the reflection means and the light-transmitting substrate, the height h of the reflection means measured from a contacting surface of the light-transmitting substrate with the first electrode is set so as to satisfy:

$$h \geq H \cdot 4t/(1+3t)$$

where:
t=d/D,
D: the distance between the centers of two reflection means surrounding the organic electroluminescent device,
d: the distance between two reflecting surfaces of the two reflection means facing the organic electroluminescent device, and
H: the distance between the contacting surface and an opposite surface of the light-transmitting substrate.

34. A light-emitting device as claimed in claim 30, wherein a surface of the light-transmitting substrate opposite to the first electrode is provided with a second light-transmitting substrate having a refractive index higher than that of the light-emitting layer and having light-diffusing means for diffusing the light emitted by the organic electroluminescent device on its surface opposite to the light-transmitting substrate.

35. A light-emitting device as claimed in claim 34, wherein the refractive index of the second light-transmitting substrate is set higher than that of the light-transmitting substrate.

36. A light-emitting device as claimed in claim 34, wherein the light-transmitting substrate and the second light-transmitting substrate are formed of resin.

37. A light-emitting device as claimed in claim 36, further comprising a gas barrier layer which is provided between the light-transmitting substrate and the second light-transmitting substrate.

38. A light-emitting device as claimed in claim 37, wherein the gas barrier layer is formed of material having gas barrier properties against $H_2O$ and/or oxygen.

39. A light-emitting device as claimed in claim 37, further comprising a third light-transmitting substrate having a refractive index higher than that of the light-emitting layer which is provided between the gas barrier layer and the light-transmitting substrate.

40. A light-emitting device as claimed in claim 30, wherein the reflection means is formed by metal that is embedded in the light-transmitting substrate.

41. A light-emitting device as claimed in claim 40, wherein metal whose work function is 4.3 eV or less is employed as the metal embedded in the light-transmitting substrate.

42. A light-emitting device as claimed in claim 40, wherein the metal embedded in the light-transmitting substrate is formed so as to function also as an assist electrode for the first electrode.

43. A light-emitting device as claimed in claim 42, wherein metal whose work function is 4.3 eV or less is employed as the metal embedded in the light-transmitting substrate.

44. A display device comprising:
a plurality of first lines arranged in the same direction;
a plurality of second lines arranged perpendicular to the first lines;
the light-emitting devices of claim 30 which are placed corresponding to a plurality of pixel areas of the display device which are formed in a matrix of rows and columns by the first lines and the second lines;
a voltage control circuit for controlling the voltages of the first lines and the second lines;
common power supply lines for supplying driving currents to the light-emitting devices; and
thin-film transistors each of which is provided corresponding to each pixel, for receiving a video signal at its gate and controlling the conduction between the common power supply line and the organic electroluminescent device.

45. A display device as claimed in claim 44, wherein:
the reflection means of the light-emitting devices are implemented by arranging a plurality of combshaped metal parts, and
each of the combshaped metal parts is formed so as to function also as an assist electrode for the first electrode.

46. A display device as claimed in claim 44, wherein:
the reflection means of the light-emitting devices are implemented by arranging a plurality of metal parts having through-holes, and
each of the metal parts having the through-holes is formed so as to function also as an assist electrode for the first electrode.

47. A display device comprising:
a plurality of first lines arranged in the same direction;
a plurality of second lines arranged perpendicular to the first lines;
the light-emitting devices of claim 31 which are placed corresponding to a plurality of pixel areas of the display device which are formed in a matrix of rows and columns by the first lines and the second lines;
a voltage control circuit for controlling the voltages of the first lines and the second lines;
common power supply lines for supplying driving currents to the light-emitting devices; and
thin-film transistors each of which is provided corresponding to each pixel, for receiving a video signal at its gate and controlling the conduction between the common power supply line and the organic electroluminescent device.

48. A display device as claimed in claim 47, wherein:
the reflection means of the light-emitting devices are implemented by arranging a plurality of combshaped metal parts, and
each of the combshaped metal parts is formed so as to function also as an assist electrode for the first electrode.

49. A display device as claimed in claim 47, wherein:
the reflection means of the light-emitting devices are implemented by arranging a plurality of metal parts having through-holes, and
each of the metal parts having the through-holes is formed so as to function also as an assist electrode for the first electrode.

50. A display device comprising:
a plurality of first lines arranged in the same direction;
a plurality of second lines arranged perpendicular to the first lines;
the light-emitting devices of claim 32 which are placed corresponding to a plurality of pixel areas of the display device which are formed in a matrix of rows and columns by the first lines and the second lines;
a voltage control circuit for controlling the voltages of the first lines and the second lines;
common power supply lines for supplying driving currents to the light-emitting devices; and
thin-film transistors each of which is provided corresponding to each pixel, for receiving a video signal at its gate and controlling the conduction between the common power supply line and the organic electroluminescent device.

51. A display device as claimed in claim 50, wherein:
the reflection means of the light-emitting devices are implemented by arranging a plurality of combshaped metal parts, and
each of the combshaped metal parts is formed so as to function also as an assist electrode for the first electrode.

52. A display device as claimed in claim 50, wherein:
the reflection means of the light-emitting devices are implemented by arranging a plurality of metal parts having through-holes, and
each of the metal parts having the through-holes is formed so as to function also as an assist electrode for the first electrode.

53. A display device comprising:
a plurality of first lines arranged in the same direction;
a plurality of second lines arranged perpendicular to the first lines;
the light-emitting devices of claim 33 which are placed corresponding to a plurality of pixel areas of the display device which are formed in a matrix of rows and columns by the first lines and the second lines;
a voltage control circuit for controlling the voltages of the first lines and the second lines;
common power supply lines for supplying driving currents to the light-emitting devices; and
thin-film transistors each of which is provided corresponding to each pixel, for receiving a video signal at its gate and controlling the conduction between the common power supply line and the organic electroluminescent device.

54. A display device as claimed in claim 53, wherein:
the reflection means of the light-emitting devices are implemented by arranging a plurality of combshaped metal parts, and
each of the combshaped metal parts is formed so as to function also as an assist electrode for the first electrode.

55. A display device as claimed in claim 53, wherein:
the reflection means of the light-emitting devices are implemented by arranging a plurality of metal parts having through-holes, and
each of the metal parts having the through-holes is formed so as to function also as an assist electrode for the first electrode.

56. A display device comprising:

a plurality of first lines arranged in the same direction;

a plurality of second lines arranged perpendicular to the first lines;

the light-emitting devices of claim 34 which are placed corresponding to a plurality of pixel areas of the display device which are formed in a matrix of rows and columns by the first lines and the second lines;

a voltage control circuit for controlling the voltages of the first lines and the second lines;

common power supply lines for supplying driving currents to the light-emitting devices; and thin-film transistors each of which is provided corresponding to each pixel, for receiving a video signal at its gate and controlling the conduction between the common power supply line and the organic electroluminescent device.

57. A display device as claimed in claim 56, wherein:

the reflection means of the light-emitting devices are implemented by arranging a plurality of combshaped metal parts, and each of the combshaped metal parts is formed so as to function also as an assist electrode for the first electrode.

58. A display device as claimed in claim 56, wherein:

the reflection means of the light-emitting devices are implemented by arranging a plurality of metal parts having through-holes, and each of the metal parts having the through-holes is formed so as to function also as an assist electrode for the first electrode.

59. A light-emitting device comprising an organic electroluminescent device including one or more organic thin layers at least including a light-emitting layer which are sandwiched between a transparent first electrode formed on a light-transmitting substrate and a second electrode, wherein:

the light-transmitting substrate has a refractive index of 1.65 or more, and a surface of the light-transmitting substrate opposite to the first electrode is provided with light-diffusing means for diffusing light emitted by the organic electroluminescent device.

60. A display device comprising:

a plurality of first lines arranged in the same direction;

a plurality of second lines arranged perpendicular to the first lines;

the light-emitting devices of claim 59 which are placed corresponding to a plurality of pixel areas of the display device which are formed in a matrix of rows and columns by the first lines and the second lines;

a voltage control circuit for controlling the voltages of the first lines and the second lines;

common power supply lines for supplying driving currents to the light-emitting devices; and thin-film transistors each of which is provided corresponding to each pixel, for receiving a video signal at its gate and controlling the conduction between the common power supply line and the organic electroluminescent device.

61. A light-emitting device comprising an organic electroluminescent device including one or more organic thin layers at least including a light-emitting layer which are sandwiched between a transparent first electrode formed on a light-transmitting substrate and a second electrode, wherein:

the light-transmitting substrate has a refractive index higher than that of the light-emitting layer, and a surface of the light-transmitting substrate opposite to the first electrode is provided with light-diffusing means for diffusing light emitted by the organic electroluminescent device.

62. A display device comprising:

a plurality of first lines arranged in the same direction;

a plurality of second lines arranged perpendicular to the first lines;

the light-emitting devices of claim 61 which are placed corresponding to a plurality of pixel areas of the display device which are formed in a matrix of rows and columns by the first lines and the second lines;

a voltage control circuit for controlling the voltages of the first lines and the second lines;

common power supply lines for supplying driving currents to the light-emitting devices; and thin-film transistors each of which is provided corresponding to each pixel, for receiving a video signal at its gate and controlling the conduction between the common power supply line and the organic electroluminescent device.

* * * * *